United States Patent
Holloway et al.

(10) Patent No.: US 8,039,366 B2
(45) Date of Patent: Oct. 18, 2011

(54) METHOD FOR PROVIDING ROTATIONALLY SYMMETRIC ALIGNMENT MARKS FOR AN ALIGNMENT SYSTEM THAT REQUIRES ASYMMETRIC GEOMETRIC LAYOUT

(75) Inventors: Karen L. Holloway, Poughkeepsie, NY (US); Holly LaFerrara, Wappingers Falls, NY (US); Alexander L. Martin, Hopewell Junction, NY (US); Martin E. Powell, Peekskill, NY (US); Timothy J. Wiltshire, Fishkill, NY (US); Roger J. Yerdon, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 12/388,851

(22) Filed: Feb. 19, 2009

(65) Prior Publication Data

US 2010/0207284 A1 Aug. 19, 2010

(51) Int. Cl.
*H01L 21/00* (2006.01)
*H01L 23/544* (2006.01)
(52) U.S. Cl. ........................................ 438/462; 257/797
(58) Field of Classification Search ................... 438/401, 438/462, 975; 257/797
See application file for complete search history.

(56) References Cited

U.S. PATENT DOCUMENTS

| | | | |
|---|---|---|---|
| 5,521,036 A | 5/1996 | Iwamoto et al. | |
| 6,071,656 A | 6/2000 | Lin | |
| 6,190,807 B1 | 2/2001 | Wang et al. | |
| 6,384,899 B1 | 5/2002 | Den Boef | |
| 6,961,116 B2 | 11/2005 | Den Boef et al. | |
| 7,099,010 B2 | 8/2006 | Schulz | |
| 7,099,011 B2 | 8/2006 | McArthur et al. | |
| 7,112,813 B2 | 9/2006 | Den Boef et al. | |
| 7,170,604 B2 | 1/2007 | Sezginer et al. | |
| 7,218,400 B2 | 5/2007 | Ho et al. | |
| 7,283,236 B2 | 10/2007 | Presura et al. | |
| 7,319,506 B2 * | 1/2008 | Den Boef et al. | 355/53 |
| 7,330,261 B2 | 2/2008 | Van Haren et al. | |
| 7,332,732 B2 * | 2/2008 | Van Bilsen et al. | 250/548 |
| 7,405,025 B2 | 7/2008 | Yaegashi et al. | |
| 7,863,763 B2 * | 1/2011 | Van Haren et al. | 257/797 |

* cited by examiner

*Primary Examiner* — Calvin Lee
(74) *Attorney, Agent, or Firm* — Wenjie Li, Esq.; Gibb I.P. Law Firm, LLC

(57) ABSTRACT

A method and apparatus includes an integrated circuit device, and at least one alignment mark on the integrated circuit device, the alignment mark comprises a first coded region, a second coded region adjacent the first coded region, and a third coded region adjacent the second coded region, the second coded region located between the first coded region and the third coded region, and markings on the first coded region and the third coded region being identical.

20 Claims, 3 Drawing Sheets

METHOD FOR PROVIDING ROTATIONALLY SYMMETRIC ALIGNMENT MARKS FOR AN ALIGNMENT SYSTEM THAT REQUIRES ASYMMETRIC GEOMETRIC LAYOUT

BACKGROUND OF THE INVENTION

1. Field of the Invention

The present invention generally relates to a method and apparatus of alignment marks on a semiconductor wafer that allow the alignment marks to be used when the semiconductor wafer or alignment marks are rotated 180 degrees from its expected orientation.

2. Description of the Related Art

The problem of the prior art alignment marks used in photo lithography tools, (for example, with ASLM™), is that improperly oriented alignment marks do not work properly. For example, if alignment marks are inadvertently rotated 180 degrees from expected orientation, the data contained in the alignment marks cannot be read properly.

Some solutions to this problem have been to buy new masks with properly placed alignment marks or to drop in additional alignment marks of a second mask. Problems with these known solutions are that new masks can be very costly ($100K or more in some cases) and dropping alignment marks off a second reticle can degrade the overall overlay performance by increasing the number of overlay error sources.

The solution to this problem should address both of these deficiencies and provide a significant cost improvement rather than fixing and/or reordering new masks. The solution should provide that there is no degradation in overlay performance. The solution can not only address yield issues, but can also prevent devices from being defective.

SUMMARY OF THE INVENTION

In view of the foregoing and other exemplary problems, drawbacks, and disadvantages of the conventional methods and structures, the exemplary aspects of the present invention provide an integrated circuit device, and at least one alignment mark on the integrated circuit device. The alignment mark comprises a first coded region, a second coded region adjacent the first coded region, and a third coded region adjacent the second coded region. The second coded region located (positioned) between the first coded region and the third coded region. Markings on the first coded region and the third coded region are identical.

Another exemplary aspect of the present invention includes an integrated circuit device, and at least one alignment mark on the integrated circuit device. The alignment mark comprises a first coded region, a second coded region adjacent the first coded region, and a third coded region adjacent the second coded region. The second coded region located (positioned) between the first coded region and the third coded region. Markings on the first coded region and the third coded region are identical and at a different pitch than the second coded region.

The first, second and third coded regions are generally aligned along a common linear direction, but do not need to be. The first, second and third coded regions can comprise a barcode, a glyph, and/or a computer readable graphic marking, etc. The first gap between the first coded region and the second coded region can be equal in dimension to a second gap between the second coded region and the third coded region. The geometric center of data for the alignment mark can be at the midpoint in the second coded region. The alignment mark can be symmetric about a line intersecting the midpoint and orthogonal to a common linear direction of the alignment mark.

One method herein includes supplying an integrated circuit device and placing at least one alignment mark on the integrated circuit device. The alignment mark comprises a first coded region, a second coded region adjacent the first coded region, and a third coded region adjacent the second coded region. The second coded region located between the first coded region and the third coded region. The first coded region and the third coded region are identical.

Another method herein includes supplying an integrated circuit device and placing at least one alignment mark on the integrated circuit device. The alignment mark comprises a first coded region, a second coded region adjacent the first coded region, and a third coded region adjacent the second coded region. The second coded region located between the first coded region and the third coded region. The markings on the first coded region and the third coded region being a different pitch than the second coded region.

Another method herein includes aligning the first, second and third coded regions along a common linear direction. Another method herein includes the first, second and third coded regions further include one from the group of a barcode, a glyph, and/or a computer readable graphic marking. Another method herein includes leaving a first gap between the first coded region and the second coded region, and leaving a second gap between the second coded region and the third coded region, the first gap is equal in dimension to the second gap. Another method herein includes aligning a geometric center of data for the alignment mark at a midpoint of the second coded region. The alignment mark is symmetric about a line intersecting the midpoint and orthogonal to a common linear direction of the at least one alignment mark.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications can be made within the scope of the embodiments of the invention without departing from the spirit thereof, and the embodiments of the invention include all such modifications.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS

Figure 1:
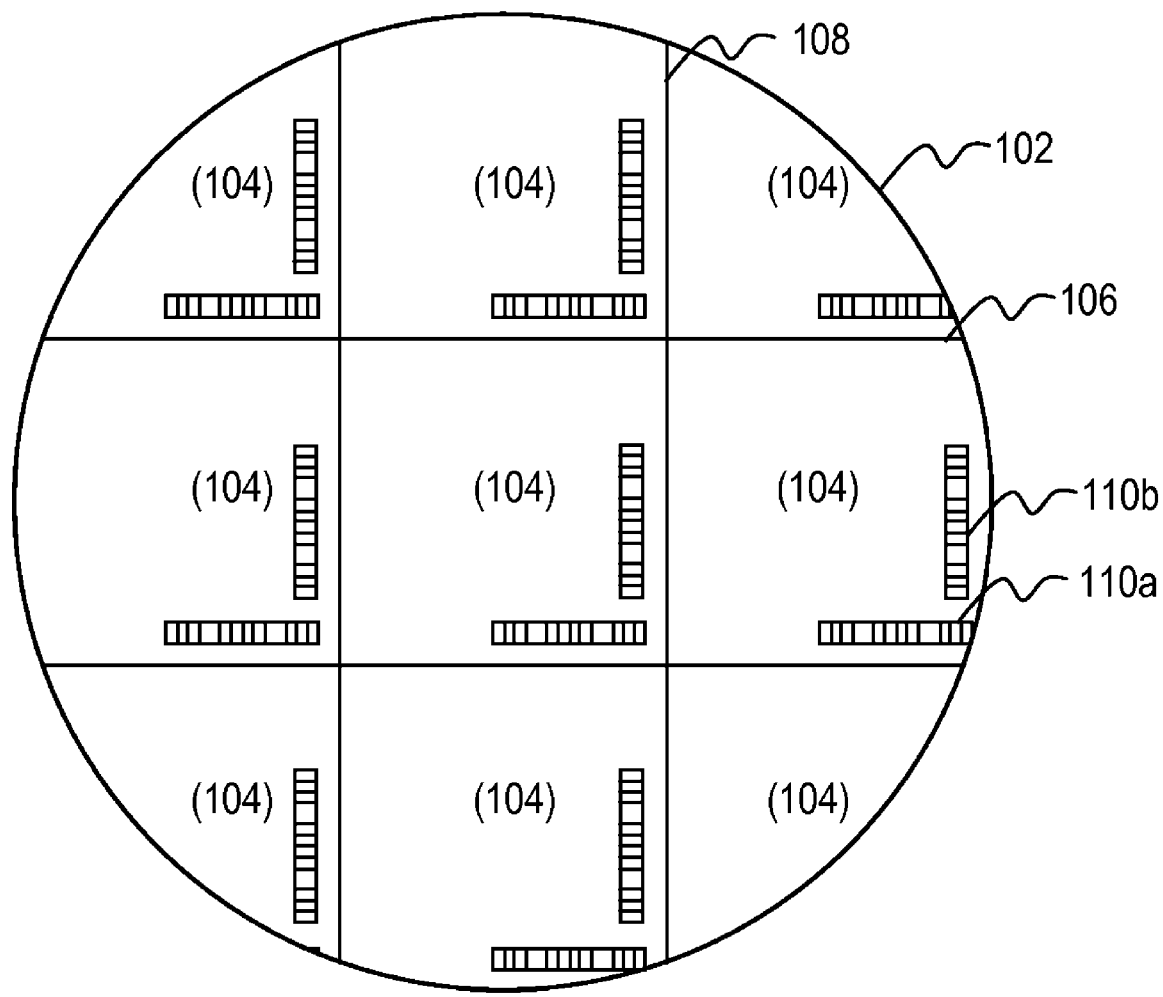
FIG. 1 illustrates a schematic diagram of a wafer.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention can be practiced and to further enable those of skill in the art to practice the embodiments of the invention. Accordingly, the examples should not be construed as limiting the scope of the embodiments of the invention.

Referring now to the drawings, and more particularly to FIGS. 1-4, there are shown exemplary embodiments of the method and apparatus of the present invention.

Semiconductor processing requires the alignment of a "layer B" to a "layer A." Typically, a vendor (for example, ASML™), supplies designs of alignment marks compatible with their semiconductor fabricating equipment. These alignment marks are not rotationally symmetric but are asymmetrical in layout. For example, one end of a mark has 16.0 μm period and the other end of the mark has a 17.6 μm period. However, alignment marks are able to be placed where they are rotated by 180 degrees. This improper orientation causes the marks to be unreadable by manufacturing equipment and, therefore, they fail to work.

Embodiments herein provide a single alignment mark that is overall symmetric so that if it is accidentally placed 180 degrees out of the expected orientation, the alignment mark is still useful. In order to service alignment systems that expect asymmetric alignment mark content, the mark of the present invention is designed in such a manner that a subsection of the printed pattern can be used for alignment in an asymmetric manner and still satisfy the requirements of the asymmetric alignment system.

FIG. 1 illustrates a wafer 102 having a plurality of dies 104 wherein each die 104 is separated from adjacent dies by horizontal scribe lines 106 and vertical scribe lines 108. At least one, (as shown in FIG. 1), horizontal small scribe line primary mark 110a, and/or vertical small scribe line primary mark 110b is placed near the scribe lines (106 and/or 108) to allow for intra-die alignment correction. Each die 104 may comprise at least one integrated circuit device.

Figure 2:
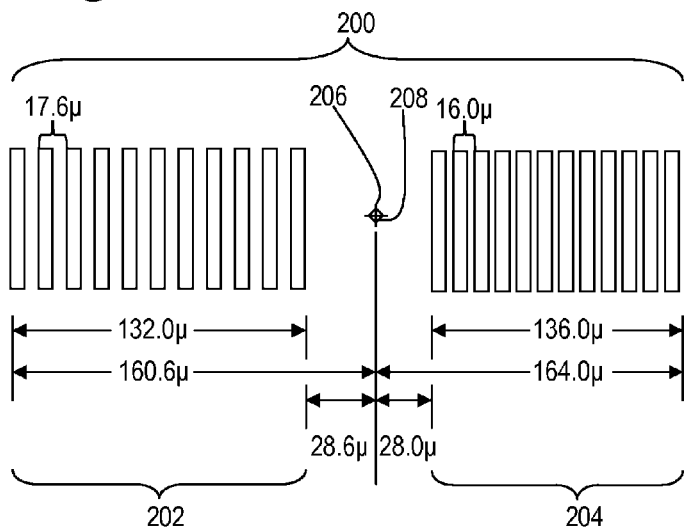
FIG. 2 illustrates a schematic diagram of alignment markings.

FIG. 2 illustrates an asymmetric alignment mark 200. The 17.6 μm period section 202 is replicated on the left side of the mark, and a 16.0 μm period section 204 is replicated on the right side of the mark. The center of the mark 206 for alignment purposes is indicated by the plus "+" symbol, whereas the center of the data 208 is indicated by a diamond "◊" symbol. If the data were to be rotated about the center of the data 208, the layout of the mark 200 at the alignment position would be inverted, and therefore, unreadable.

Figure 3A:
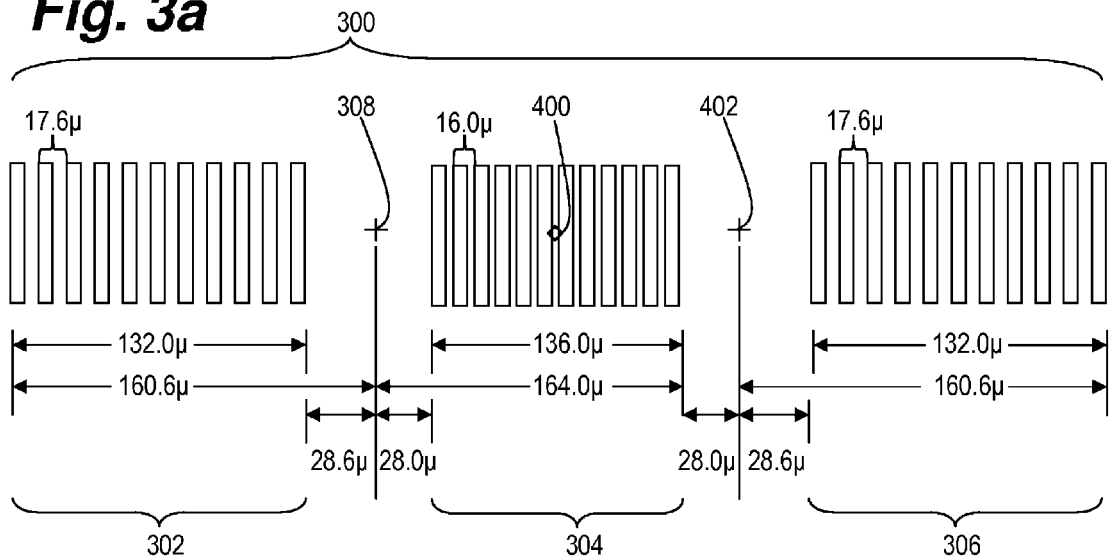
FIG. 3a illustrates a schematic diagram of alignment markings.

FIG. 3a illustrates a symmetric alignment mark 300. Here, a 17.6 μm period section 302 is replicated (positioned) on the left side of the mark, and a center 16.0 μm period section 304 is replicated (positioned) to the right of left section 302 in the same manner as described above in FIG. 2. However, a third 17.6 μm period section 306 is replicated to the right of section center section 304 and on the right side of the mark 300. Section 306 is identical in data and form to the left section 302.

The center of the mark 308 for alignment purposes is indicated by the plus "+" symbol when the alignment mark 300 is (positioned) in a first orientation. However, the center of the data 310, indicated by a diamond "\" symbol, is now (positioned) in a midpoint of the center section 304.

Figure 3B:
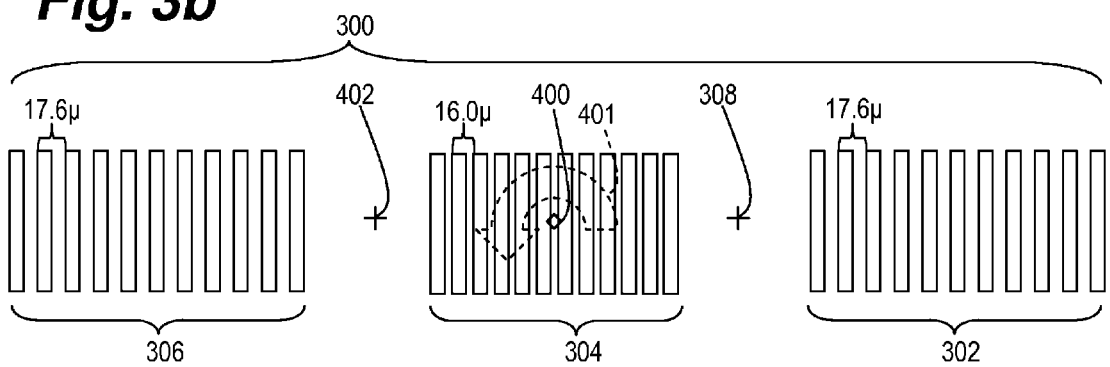
FIG. 3b illustrates a schematic diagram where the alignment mark of FIG. 3 is rotated 180 degrees.

FIG. 3b, illustrates when the mark 300 of FIG. 3a is rotated about the center of the data 310 as illustrated by the counter-clockwise direction arrow 314. In this orientation, the layout of the mark 300 of FIG. 3b at the alignment position would remain the same when the third section 306 is now located on the opposite side the mark, i.e., in FIG. 3b, now on the left side of the mark 300 as compared with being located on the right side of the mark 300 as illustrated in FIG. 3a.

This ability of the present invention to rotate about the center of data and be readable in both orientations is unlike the standard ASML mark 200 of FIG. 2 that cannot be read when rotated about the center of data/mark 206/208. The new center of the mark 312 for alignment purposes (in FIG. 3b) is indicated by the plus "+" symbol when the alignment mark 300 is (positioned) in a second orientation 180 degrees from the first orientation illustrated in FIG. 3a.

The apparatus of the present invention includes an integrated circuit device 104, and at least one alignment mark 300 on the integrated circuit device 104. The alignment mark 300 comprises a first coded region 302, a second coded region 304 adjacent the first coded region 302, and a third coded region 306 adjacent the second coded region 304. The second coded region 304 located between the first coded region 302 and the third coded region 304. Markings on the first coded region 304 and the third coded region 306 being identical.

Markings on the first coded region 302 and the third coded region 306 are identical and at a different pitch (a 17.6 μm period section) than the second coded region 304 (a 16.0 μm period section). The first 302, second 304 and third 306 coded regions are generally aligned along a common linear direction and can comprise a barcode, a glyph, and/or computer readable graphic markings. A first gap between the first coded region 302 and the second coded region 304 can be equal in dimension to a second gap between the second coded region 304 and the third coded region 306. Here, each gap is exemplarily illustrated to be 56.6 μm in length (28.6 μm+28.0 μm). A geometric center of data 310 for the alignment mark 300 is at a midpoint in the second coded region 304, where the alignment mark 300 is symmetric about a line intersecting the midpoint and orthogonal to a common linear direction of the at least one alignment mark 300.

Figure 4:
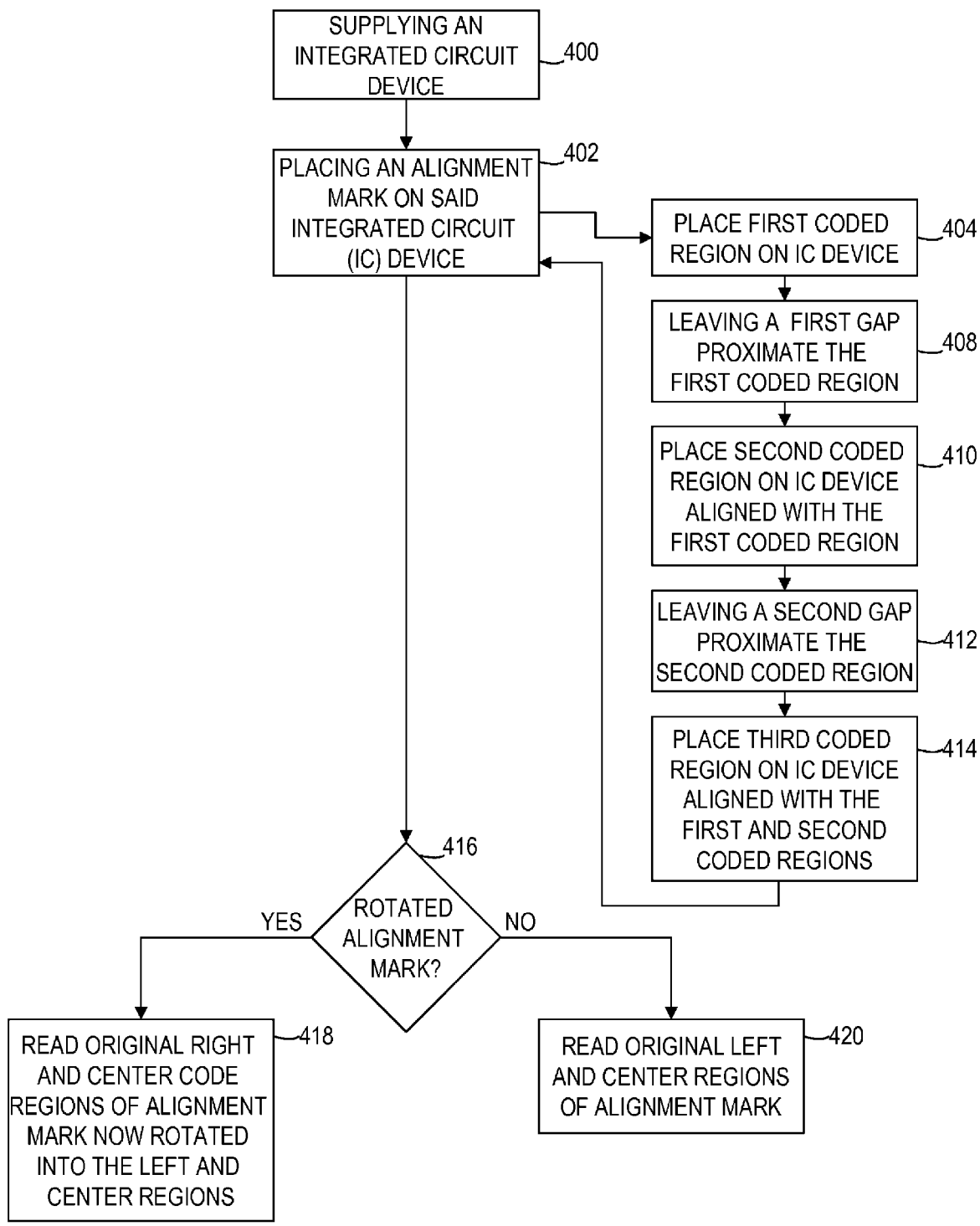
FIG. 4 illustrates a flow-chart logic diagram of a method of an exemplary embodiment herein.

A method herein is illustrated in FIG. 4 includes supplying 400 an integrated circuit device, (e.g., on a wafer 102 of FIG. 1 on a specific die 104), and placing at least one alignment mark 300 on the integrated circuit device 402. Placing the alignment mark 402 includes, (see FIGS. 3a-3b), placing 404 a first coded region 302 of the alignment mark, placing 410 a second coded region 304 adjacent the first coded region 302, and placing 414 a third coded region 306 adjacent the second coded region 304. The second coded region 304 is located between the first coded region 302 and the third coded region 306. The first coded region 302 and the third coded region 306 are identical.

Additionally, markings on the first coded region 302 and the third coded region 306 are a different pitch than the second coded region 304. The method includes aligning the first 302, second 304 and third 306 coded regions along a common linear direction 410, 414, where each of the coded regions (302, 304, 306) may include a barcode (FIGS. 3a-3b), a glyph, and/or a computer readable graphic marking. The method includes leaving a first gap 408 between the first coded region 302 and the second coded region 304, and leaving a second gap 412 between the second coded region 304 and the third coded region 306, where the first gap is equal in dimension to the second gap.

As a result of the alignment of each region and the corresponding gaps between the regions, the geometric center of data for the alignment mark 300 is at a midpoint 310 of the second coded region 304, the at least one alignment mark 300 is symmetric about a line intersecting the midpoint 310 and orthogonal to a common linear direction of the at least one alignment mark 300.

After the alignment mark is placed on the semiconductor (IC) device, it is determined whether the mark may or may not be rotated 416. If the mark 300 is determined not to be rotated, the left 302 and center 304 coded regions of the alignment mark 300 are read 420 by the fabrication machinery in the same manner as the prior art mark illustrated in FIG. 2. However, if the mark 300 is determined to be rotated, the juxtaposed original right coded region 306 and the reversed center 304 coded region of the alignment mark 300 are now capable of being read 418 by the fabrication machinery now rotated into the left and center positions without error 418.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method comprising:
    supplying an integrated circuit device; and
    placing at least one alignment mark on said integrated circuit device,
    said alignment mark comprising a first coded region, a second coded region adjacent said first coded region, and a third coded region adjacent said second coded region,
    said second coded region being located between said first coded region and said third coded region, and
    said first coded region and said third coded region being identical,
    said at least one alignment mark being symmetric about a line intersecting a midpoint of said second coded region and orthogonal to a common linear direction of said at least one alignment mark.

2. The method according to claim 1, said placing said at least one alignment mark further comprises:
    aligning said first, second and third coded regions along a common linear direction.

3. The method according to claim 1, wherein said first, second and third coded regions further comprise at least one of:
    a barcode;
    a glyph; and
    a computer readable graphic marking.

4. The method according to claim 1, further comprising:
    leaving a first gap between said first coded region and said second coded region, and
    leaving a second gap between said second coded region and said third coded region, said first gap being equal in dimension to said second gap.

5. The method according to claim 1, said placing said at least one alignment mark further comprises:
    aligning a geometric center of data for said at least one alignment mark at said midpoint of said second coded region.

6. A method comprising:
    supplying an integrated circuit device; and
    placing at least one alignment mark on said integrated circuit device,
    said alignment mark comprising a first coded region, a second coded region adjacent said first coded region, and a third coded region adjacent said second coded region,
    said second coded region being located between said first coded region and said third coded region, and
    markings on said first coded region and said third coded region being a different pitch than said second coded region,
    said at least one alignment mark being symmetric about a line intersecting a midpoint of said second coded region and orthogonal to a common linear direction of said at least one alignment mark.

7. The method according to claim 6, said placing said at least one alignment mark further comprises:
    aligning said first, second and third coded regions along a common linear direction.

8. The method according to claim 6, wherein said first, second and third coded regions further comprise at least one of:
    a barcode;
    a glyph; and
    a computer readable graphic marking.

9. The method according to claim 6, further comprising:
    leaving a first gap between said first coded region and said second coded region, and
    leaving a second gap between said second coded region and said third coded region, said first gap being equal in dimension to said second gap.

10. The method according to claim 6, said placing said at least one alignment mark further comprises:
    aligning a geometric center of data for said at least one alignment mark at said midpoint of said second coded region.

11. An apparatus comprising:
    an integrated circuit device; and
    at least one alignment mark on said integrated circuit device,
    said alignment mark comprising a first coded region, a second coded region adjacent said first coded region, and a third coded region adjacent said second coded region,
    said second coded region being located between said first coded region and said third coded region, and
    markings on said first coded region and said third coded region being identical,
    said at least one alignment mark being symmetric about a line intersecting a midpoint in said second coded region and orthogonal to a common linear direction of said at least one alignment mark.

12. The apparatus according to claim 11, wherein said first, second and third coded regions are aligned along a common linear direction.

13. The apparatus according to claim 11, wherein said first, second and third coded regions further comprise at least one of:
- a barcode;
- a glyph; and
- a computer readable graphic marking.

14. The apparatus according to claim 11, wherein a first gap between said first coded region and said second coded region is equal in dimension to a second gap between said second coded region and said third coded region.

15. The apparatus according to claim 11, wherein a geometric center of data for said at least one alignment mark is at said midpoint in said second coded region.

16. An apparatus comprising:
- an integrated circuit device; and
- at least one alignment mark on said integrated circuit device,
- said alignment mark comprising a first coded region, a second coded region adjacent said first coded region, and a third coded region adjacent said second coded region,
- said second coded region being located between said first coded region and said third coded region, and markings on said first coded region and said third coded region being a different pitch than said second coded region,
- said at least one alignment mark being symmetric about a line intersecting a midpoint in said second coded region and orthogonal to a common linear direction of said at least one alignment mark.

17. The apparatus according to claim 16, wherein said first, second and third coded regions are aligned along a common linear direction.

18. The apparatus according to claim 16, wherein said first, second and third coded regions further comprise at least one of:
- a barcode;
- a glyph; and
- a computer readable graphic marking.

19. The apparatus according to claim 16, wherein a first gap between said first coded region and said second coded region is equal in dimension to a second gap between said second coded region and said third coded region.

20. The apparatus according to claim 16, wherein a geometric center of data for said at least one alignment mark is at said midpoint in said second coded region.

\* \* \* \* \*